United States Patent [19]

Geisler et al.

[11] Patent Number: 4,933,064

[45] Date of Patent: Jun. 12, 1990

[54] SPUTTERING CATHODE BASED ON THE MAGNETRON PRINCIPLE

[75] Inventors: Michael Geisler, Wächtersbach; Jörg Kieser, Albstadt; Reiner Kukla, Hanau, all of Fed. Rep. of Germany

[73] Assignee: Leybold-Heraeus GmbH, Cologne, Fed. Rep. of Germany

[21] Appl. No.: 126,776

[22] Filed: Nov. 30, 1987

Related U.S. Application Data

[63] Continuation of Ser. No. 892,711, Jul. 31, 1986, abandoned.

[30] Foreign Application Priority Data

Aug. 1, 1985 [DE] Fed. Rep. of Germany ....... 3527626

[51] Int. Cl.$^5$ .............................................. C23C 14/34
[52] U.S. Cl. ............................ 204/298.17; 204/192.12; 204/298.21
[58] Field of Search ........... 204/192.12, 298, 298 ME, 204/298 PM, 298 CS, 298 WH, 298 FP, 298 CM

[56] References Cited

U.S. PATENT DOCUMENTS

| | | | |
|---|---|---|---|
| 4,431,505 | 2/1984 | Morrison, Jr. | 204/298 |
| 4,486,287 | 12/1984 | Fournier | 204/192 R |
| 4,515,675 | 5/1985 | Kieser et al. | 204/298 |
| 4,572,776 | 2/1986 | Aichert et al. | 204/298 |

Primary Examiner—Nam X. Nguyen
Attorney, Agent, or Firm—Felfe & Lynch

[57] ABSTRACT

A sputtering cathode for the coating of substrates. The cathode has a base, a target of nonmagnetic material, and a magnet system having exposed pole faces for the production of a tunnel of magnetic lines of force overarching the sputtering surface. The target is provided with at least two continuous projections lying one inside the other, which contain at least one sputtering surface between them, and have confronting wall surfaces. The pole faces are located on both sides of the projections and sputtering surface between them such that magnetic lines of force issue perpendicularly from the one wall surface and, after crossing the sputtering surface, re-enter perpendicularly the opposite wall surface. The magnet system has permanent magnets magnetized parallel to the projections, which are yoked together on the sides facing away from the projections by a soft-magnetic base, and are provided on the sides facing the projections with soft-magnetic pole shoes extending over at least a part of the height of the projections.

3 Claims, 4 Drawing Sheets

SPUTTERING CATHODE BASED ON THE MAGNETRON PRINCIPLE

This is a continuation application of application Ser. No. 892,711, filed July 31, 1986, now abandoned.

BACKGROUND OF THE INVENTION

The invention relates to a sputtering cathode for coating substrates in cathode sputtering apparatus. Such cathode has a cathode base body and a target disposed thereon composed of nonmagnetic material with a sputtering surface, and a magnet system containing permanent magnets with exposed pole faces for the entry and exit of the magnetic lines of force for the production of a closed tunnel of magnetic lines of force overarching the sputtering surface, and having shielding which does not cover the surfaces serving for sputtering and which overreaches at least the magnet system. In such a cathode, (a) the target is provided with at least two circumferential projections lying concentrically one within the other, and consisting exclusively of nonmagnetic material, which have the at least one sputtering surface enclosed between them and wall surfaces facing one another whose generatrices are substantially perpendicular to the sputtering surface, and (b) the pole faces on either side of the projections and of the sputtering surface lying between them are drawn forward in the sputtering direction to such a distance above the plane (E—E) in which the sputtering surface lies, that an important part of the magnetic lines of force issue in a substantially vertical direction from the one face of the one projection and, after crossing the sputtering surface, re-enter the other, opposite face of the other projection in a substantially perpendicular direction.

Sputtering cathodes for product coating are known which have sputtering surfaces in a great number of geometrical shapes. All systems have it in common that a closed tunnel of magnetic lines of force is produced over the sputtering surface by a magnet system situated behind it, the tunnel serving for the concentration of the plasma, and considerably increasing the ionization probability necessary for the formation of a glow discharge. The result in every case is a substantially higher sputtering rate for the same sputtering material—all other process parameters being equal—than without the aid of a magnetic field.

The term, "magnetic tunnel," used herein, is to be understood to mean the tunnel-like enclosure of a spatially defined area by magnetic lines of force, regardless of whether the lines of force follow a curbed course reaching all the way to the sputtering surface, or follow a straight course representing merely a cover over a trough-shaped groove.

The term "projection" is to be understood in relation to the plane "E—E" in which the sputtering surface lies. The direction of the projections consequently is perpendicular to this plane E—E, at least in reference to the surface of each projection that faces the sputtering surface. The expression "projection" furthermore refers to the original (virgin) state of the target, and is not to be confused with the elevations left standing on either side of the erosion pit in the state of the art, for merely due to the angle they form with the plane E—E they do not provide the conditions for a reliable inclusion of the plasma. The projections and the part of the target bearing the sputtering surface form one electrical and mechanical unit, in contrast, for example, to the state of the art according to DE-OS 34 11 536 in which the housing parts projecting on both sides of the target margins are insulated from the target, so that they can adjust themselves to an intermediate potential conditioned by the process parameters. A height amounting to a few dark-space intervals, i.e., about 8 mm, advantageously suffices for the height of the projections.

The statement that an important part of the magnetic lines of force emerge from the one wall surface and re-enter the other in a substantially perpendicular direction is not to be understood to mean strictly a viewing angle of 90 degrees. Experience has shown that a deviation of up to about 15 to 20 degrees from this angle is harmless, so that the angle of emergence and entry can also amount to 70 degrees.

A sputtering cathode of the kind described in the beginning is disclosed in U.S. Pat. No. 4,486,287. In it, however, the permanent magnets are magnetized transversely of the projections, i.e., parallel to the sputtering surface. In the case of a circular sputtering surface, the direction of magnetization is therefore radial. This results on the one hand in a larger outside diameter of the cathode, and on the other hand the permanent magnets and the yokes joining them to the base body occupy a relatively great amount of space in the center of the cathode, so that small cathodes are virtually impossible to make. Similar considerations apply to oblong and rectangular cathodes.

Another disadvantage is that, in the proper use of the target material, the distance between the sputtering surface and the magnetic field at a given moment in time changes, and with it the strength of the magnetic field enclosing the plasma. This can be seen in an undesirable alteration of the characteristic curve of the magnetron, and expresses itself practically in varying rates of sputtering and of deposition on the substrates.

The invention, therefore, is addressed to the problem of devising a sputtering cathode of the kind described in the beginning, which will have a sputtering performance that is more constant in time and will permit the sputtering of thicker targets.

SUMMARY OF THE INVENTION

The solution of the stated problem is accomplished according to the invention, in the sputtering cathode described in the beginning, in that the magnet system has permanent magnets magnetized parallel to the projections, the magnets being adjoined on the sides facing away from the projections by a soft-magnetic base body geometrically similar to the sputtering surface, and being provided, on the sides facing the projections, with soft-magnetic pole shoes which extend over at least a part of the height of the projections.

The "pole faces" are those surfaces of the magnet system from which the lines of force emerge or re-enter. The pole faces are formed by the soft-magnetic pole shoe surfaces which face the target, and accordingly they can also be referred to as "diffusers" (for the lines of force).

The soft-magnetic pole shoes, or "diffusers," lead to the following advantages:

The permanent magnets commonly used have a very high gradient of their field strength. This effect is considerably reduced by the soft-magnetic pole shoes, so that the sputtering of very thick targets is thus possible, without impermissibly changing the working conditions or necessitating a mechanical shift of the magnet system with respect to the target. Furthermore, the subject matter of the invention requires much less space than a magnetron with a radial direction of magnetization having the same size of sputtering surface. In the case of oblong cathodes with rectilinear sputtering surfaces, this results in a very much smaller minimum distance between these rectilinear sputtering surfaces, so that substantially greater freedom is had in determining the deposition rate distribution.

Magnetron cathodes of the prior art can be converted to the invention without unreasonably great expense and difficulty, since it is necessary only to place the soft-magnetic pole shoes according to the invention onto the permanent magnets. By installing soft-magnetic pole shoes of modified dimensions, the entire magnetron cathode can be converted more quickly and simply to targets of a different thickness. Furthermore there is the advantage that the geometric shape of the magnetic field or magnetic tunnel can be more easily optimized by shaping the easily-machined soft-iron pole shoes. Lastly, the invention permits easier cooling of the permanent magnets, which are known to be thermally sensitive, since these magnets can be placed at thermally less exposed locations.

Let it be noted that the invention relates to the use of targets of nonmagnetic material. It is known, for the purpose of sputtering ferromagnetic targets, to provide magnet systems on the front side of the target, or to associate with the target projecting pole shoes separated by at least an air gap, or projections, likewise of ferromagnetic material, belonging to the base body of the cathode, for the purpose of creating the conditions for producing on the front surface of the target at least one closed tunnel of magnetic lines of force. The lines of force of such a magnetic tunnel, however, on account of the adjacency of the parts separated by at least an air gap, have at least mostly a relatively greatly curved configuration, so that, in such known systems, the erosion pit is restricted to a narrow area.

Embodiments of the invention will be explained in detail below with the aid of FIGS. 1 to 6.

DETAILED DESCRIPTION OF THE DRAWINGS

Figure 1:
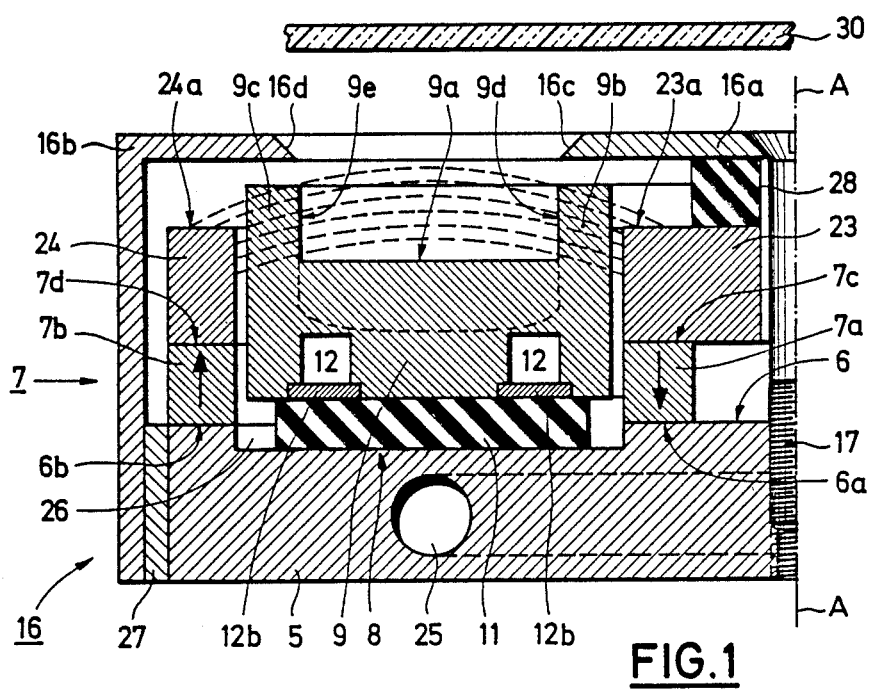
FIGS. 1 and 2 show axial half cross sections through different embodiments of the essential parts of a sputtering cathode.

In FIG. 1 there is shown a cathode base 5 which consists of a ferromagnetic material and at the same time constitutes the magnetic yoke for the magnet system to be described below. The cathode base 5 has an upper plane 6 in which lie annular bearing surfaces 6a and 6b for the permanent magnets of the magnet system 7. There is an inner ring magnet 7a and a continuous outer series of bar magnets 7b, all of which are magnetized axially with respect to the axis A—A of the system, such that the polarization of the inner ring magnet 7a is opposite that of the outer bar magnets 7b. The pole position is included in FIG. 1. The magnets have on the side opposite the cathode base 5 the end faces 7c and 7d which lie in a common plane.

Soft-magnetic pole shoes 23 and 24 then lie on the end faces 7c and 7d, the arrangement being made such that a trough-like space 26 is formed between the permanent magnets 7a, 7b and between the pole shoes 23, 24, which space 26 runs all the way around the axis A—A and is open at the top.

Between the bearing surfaces 6a and 6b lies an annular bearing surface 8 which forms the bottom of the trough-like space 26. On this bearing surface 8 rests an insulator 11 which serves for supporting a target 9. This target forms the raw material for the coatings which are to be deposited on a substrate 30 which is here represented only by indication. The target 9 has a planar sputtering surface 9b which is bounded on both sides by two continuous projections 9b and 9c, one inside the other, which consist of the same nonmagnetic material as the remainder of the target 9. The projections 9b and 9c have confronting wall faces 9d and 9e whose generatrices are perpendicular to the sputtering surface 9a. In the present case these are cylindrical surfaces.

The pole shoes 23 and 24 have, in the area of their end faces in the area of their wall surfaces defining the hollow cylindrical space 26, the pole faces 23a and 24a; only the end portions of the pole faces are numbered, for lack of space. The pole faces 23a and 24a are raised in the sputtering direction, above the plane of the sputtering surface 9a, on both sides of the projections 9b and 9c and the sputtering surface 9a between them, to such an extent that an important part of the magnetic lines of force issue in a substantially perpendicular direction from the one wall face 9e of the one projection 9c and re-enter in a substantially perpendicular direction into the other, opposite wall face 9d of the other projection 9b.

To be able to remove the amount of heat which enters the target 9 during the sputtering operation, cooling passages 12 are disposed in the bottom of the target 9; these run concentrically over a great part of their length, and are closed off at the bottom of the target 9 by annular plates 12b. The cathode base 5 is equipped with a cooling passage 25 in a similar manner.

The magnet system 7 is surrounded by a shield 16 which consists of a disk-like central part 16a and an annular peripheral part 16b. The peripheral part 16b is connected to the cathode base 5 in an electrically conductive manner by a spacer ring 27, while the central part 16a is connected to the cathode base 5 in an electrically conductive manner through a screw 17. As it can be seen in FIG. 1, the oppositely lying margins 16c and 16d also overlap the end faces of the projections 9b and 9c facing the substrate 30. On account of the relationships to be described in conjunction with FIG. 6, no glow discharge is formed in the interior of the shield 16, so there is no sputtering of the above-mentioned faces of the projections. By avoiding a straight line of sight from the outside in, the deposit of electrically conductive material on the insulator 11 is also effectively prevented. The axial distance between the central part 16a and the projection 9d is fixed by means of a spacer ring 28.

Figure 2:
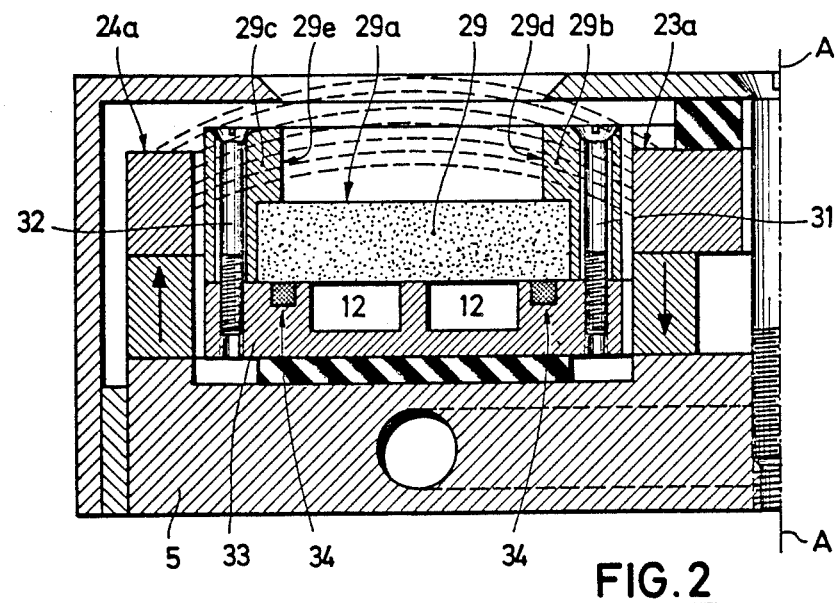

The following is shown in FIG. 2 which differs from FIG. 1: the target 29 has in this case projections 29b and 29c of a different kind of material, namely a rustproof steel (nickel-chrome steel) having likewise nonmagnetic properties. The projections 29b and 29c serve simultaneously in this case as terminal strips for the part of the target 29 that has the sputtering surface 29a. The projections 29b and 29c are clamped together with the target 29 against a support plate 33 by concentric rows of screws 31 and 32. This support plate 33 contains substantially concentric cooling passages 12, as well as annular grooves 34 with inserted gaskets (not further indicated) on both sides of these cooling passages. The transfer of heat can also be improved by providing the bottom of the target 29 with ribs increasing the surface area here. The target 29 then lies with the projections 29b and 29c and the support plate 33 on the insulator 11, as also shown in FIG. 1. The method of fastening will be further explained in conjunction with FIG. 6. An arrangement according to FIG. 2 is preferred for pressed or sintered targets 29 or for targets of dielectric materials. The principle of operation, however, is substantially unchanged, as will appear from the course of the magnetic lines of force which are indicated in broken lines.

The soft-magnetic cathode base 5, which here represents the magnetic yoke, can also be independent of the magnetic yoke, and can consist of copper, for example.

Figure 3:
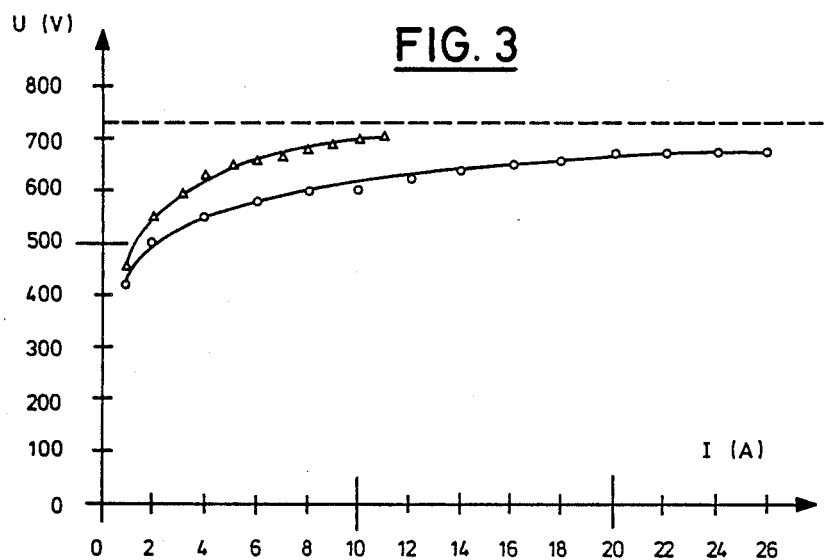
FIG. 3 is a diagram containing characteristic curves of a sputtering cathode with the target design according to the invention.

FIG. 3 shows the so-called "magnetron characteristics" of a magnetron according to FIG. 1. In this case the target consists of copper, and the average field strength at about 1 mm above the sputtering surface (measured parallel thereto) averaged ;b 17.3 kA/m. The penetration angle of the magnetic lines of force through the wall faces 9e and 9d amounts to 20 degrees outside the 15 degrees inside. The diameter of the outer wall face 9e was 153 mm, and that of the inner wall face 9d was 70 mm. The diagram in FIG. 3 shows on the abscissas the sputtering current in amperes and on the ordinates the sputtering voltage. The upper (shorter) curve is the characteristic after work amounting to 3 kWh has flowed through the cathode; the lower (longer) curve is the characteristic after work amounting to 140 kWh has flowed through the cathode. What is remarkable in this case is the especially smooth manner in which the characteristics approach a limit value (broken horizontal line). From this it can be seen that the current can be increased considerably without the need to increase the voltage to any great extent. In all cases, the maximum couplable power density (with respect to the sputtering surface contained between the wall faces) is decidedly greater than 120 watts per square centimeter. The average specific rates of deposition for the sputtering surface amounted to 0.75 nm/sec per watt per sq. cm. The distribution of the rates was largely independent of the total sputtering output. After a total sputtering of 140 kWh, a material efficiency of 58.9% was measured and calculated, and the integrated specific sputtering rate amounted to 611 cubic millimeters per kilowatt-hour.

Figure 6:
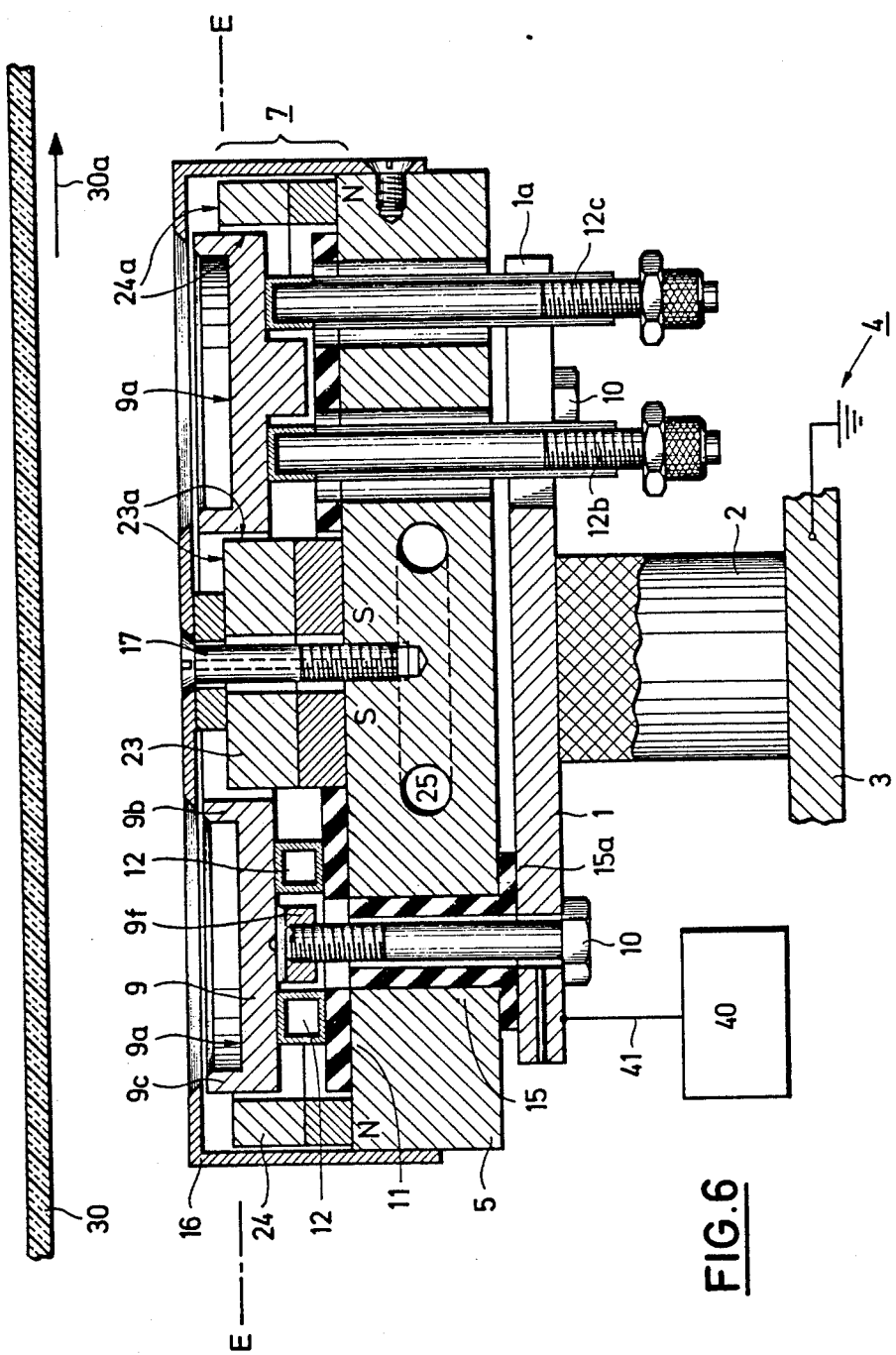
FIG. 6 is an axial cross section through a sputtering cathode ready for installation with all details, including the insulators for the different potentials.

The overall construction of the sputtering cathode is represented in FIG. 6.

Figure 4:
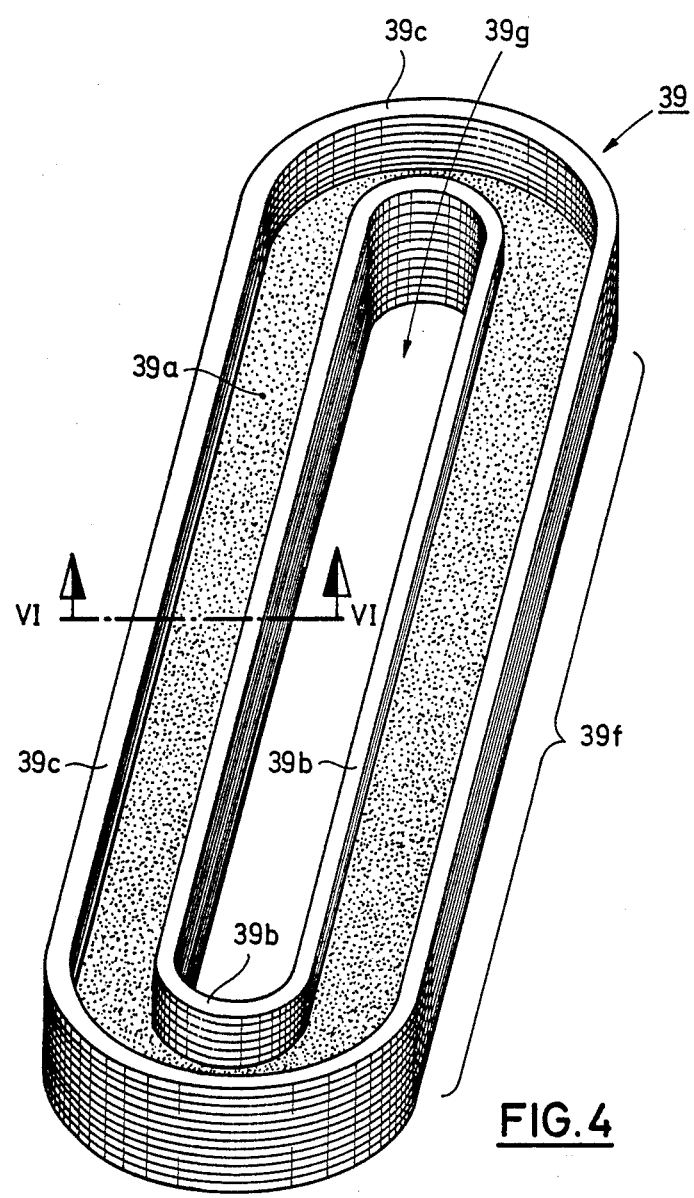
FIG. 4 is a perspective view of a target for the coating of large-area substrates.

While FIGS. 1 and 2 show radial axial cross sections through a rotationally symmetrical sputtering cathode, FIG. 4 is a perspective representation of a target 39 which it is especially desirable to use for so-called "long cathodes." It can be imagined that the target 39 in FIG. 4 was created by cutting apart a target having a circular projection surface in accordance with FIG. 1 in a diametrical plane, and inserting an elongated section 39f. The sputtering surface 39a then is in the form of a "racetrack" which is defined on both sides by the vertical projections 39b and 39c with the wall faces 39d and 39e. In the center of the elongated oval is a through-opening 39g through which fastening means can be introduced, which are not represented here. The target 39 is accompanied on its entire circumference, inside and out, by a magnet system of geometrically similar shape, like the one seen in FIG. 1. A target of this kind can be produced in a very simple manner by casting. Also possible is a manufacturing method in which the arcuate and pieces are produced by sawing apart a casting, while the linear portions inserted between them consist of an extruded or bent shape.

In the use of so-called long cathodes with oval target 9 according to FIG. 4, the substrates are usually moved transversely of the rectilinear parts of the sputtering surfaces 39a. As result, as the width of the substrates increases, only the length of section 39f needs to be increased, but not the distance between the projections 39b and 39c.

FIG. 4 also shows what is to be understood by the statement that the projections 39b and 39c are continuous and disposed concentrically one inside the other. It means that the projections are endless and enclose between them a trough of substantially uniform width. The mass centers of gravity of both projections in any case coincide.

FIG. 6 shows a complete sputtering cathode into which basically any of the targets from FIGS. 1 and 2 can be installed.

In FIG. 6, a power distribution plate 1 is shown, which is attached through a supporting insulator 2 to a vacuum chamber 3, which in turn is grounded at 4. The power distribution plate 1 is connected by a conductor 41 to a power supply unit 40 which is a DC voltage source designed for the sputtering of metallic or electrically conductive targets.

The cathod base 5 is affixed to but insulated from the cathode base 5 by the interposition of insulators 15 with collars 15a, several of which are distributed around the circumference but only one is shown in this cross section. The target 9 in the present case is largely the same as the one in FIG. 1, except that the cooling passages 12 are formed by a doubled tube of square cross section clamped between the target 9 and the insulator 11 by a number of screws distributed on the circumference, so as to assure good thermal transfer.

The screws 10 pass through the power distribution plate 1 and, with the interposition of the insulators 15, the cathode base 5, and they constitute the electrical connection to the target 9. For this purpose the target 9 is provided on its bottom with a circumferential rib 9f having taps which are engaged by the bolts 10.

The turned-down ends 12b and 12c are passed, with sufficient gaps for insulation, through bores in the cathode base 5 and through a radial gap 1a in the power distribution plate 1.

It is possible by an appropriate selection of the thickness of the insulator 11 and/or of the axial length of the pole shoes 23 and 24 to bring the sputtering surface 9a into a specific spatial relationship to the pole faces 23a and 24a (right side of FIG. 6).

It can be seen that, on account of the insulators 11 and 15, the power distribution plate 1 and the target 9 are electrically insulated from the cathode base 5 with the magnet system 7, as well as from the vacuum chamber 3 and the ground 4. While the target 9 can be brought to a particular negative potential through the power distribution plate 1, and the ground 4 also represents a particular potential (zero potential), the cathode base 5 with the magnet system 7 and the shielding 16 is electrically free and can assume an intermediate potential, given by the operating conditions, which, when reached, very quickly and automatically brings it about that there can be no sputtering of the shielding 16 and thus of the magnet system 7. The power distribution plate 1 can be provided with a dark-space shielding (not shown) so that sputtering of the power distribution plate from the rear is also prevented.

Figure 5:
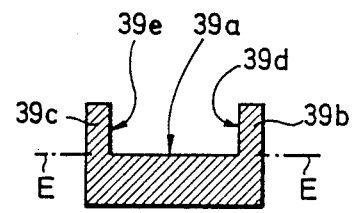
FIG. 5 is a cross section taken along line VI—VI in FIG. 4.

As already explained in conjunction with FIGS. 4 and 5, the invention is by no means limited to a rotationally symmetrical arrangement. The cross section in FIG. 6 (an axial cross section) is also representative of a cross section through a so-called long cathode with a target 39 according to FIG. 5. The sputtering cathode must then be thought of as simply elongated accordingly in the direction perpendicular to the plane of the drawing. Such cathodes can easily have lengths of about 4 meters with a width of about 30 to 40 centimeters. Also, all shapes between circular and rectangular shapes are conceivable. A substrate 30 can then be coated with great uniformity when moving relative to the cathode in the direction of the arrow 30a.

It is especially advantageous for the surfaces of projection of permanent magnets 7a and 7b, on the one hand, and pole shoes 23 and 24 on the other, to be substantially congruent. This means that the surfaces of projection are in a plane that is parallel to the sputtering surface.

It is furthermore advantageous if the end faces 7c and 7d of permanent magnets 7a and 7b are set back in relation to the sputtering surfaces 9a and 29a, and if the pole faces 23a and 24a of pole shoes 23 and 24 are extended perpendicularly to the sputtering surface to a point close to the projections 9b/9c and 29b/29c and 39b/39c, respectively.

Finally, it is of especial advantage for the end faces of the pole shoes 23 and 24 to be set back from the end faces of the projection 9b and 9c in a direction perpendicular to the sputtering surface.

In the manner described, the points at which the magnetic lines of force issue as located in the area that is best for a highly uniform sputtering over a long period of operation, with a maximum utilization of a thick target.

We claim:

1. Sputtering cathode for coating substrates in cathode sputtering apparatus, having a cathode base, a target of nonmagnetic material and a sputtering surface disposed thereon, having a magnet system containing permanent magnets with end faces for the exit and entry of the magnetic lines of force for the production of a continuous tunnel of magnetic lines of force spanning the sputtering surface, and having a shielding covering surfaces that do not serve for the sputtering and overlapping at least the magnet system, wherein
   (a) the target is provided with at least two continuous projections lying concentrically one within the other, said projections having end faces facing away from said base and wall faces facing one another and enclosing said sputtering surface therebetween, said wall faces having generatrices that are substantially perpendicular to the sputtering surface; and wherein
   (b) pole faces from which magnetic lines of force exit and enter extend on both sides of the projections and the sputtering surface between them to such a distance, in the sputtering direction above the plane in which the sputtering surface lies, that a substantial part of the magnetic lines of force issue in a substantially perpendicular direction from the one wall face of the one projection and, after crossing the sputtering surface, re-enter into the other, opposite wall face of the other projection in a substantially perpendicular direction,
   the improvement wherein the permanent magnet system has permanent magnets which are magnetized parallel to the projections and which are joined on the sides facing away from the sputtering direction by a soft-magnetic base and said permanent magnets are provided on their end faces with soft magnetic pole shoes which extend along at least part of the height of the projections such that a trough-like space is formed between the permanent magnets and between the pole shoes.

2. Sputtering cathode according to claim 1, characterized in that the permanent magnets are set back with respect to the sputtering surface so that they are not intersected by the plane of the sputtering surface, and that the pole shoes extend in a direction normal to the sputtering cathode all the way to the vicinity of the projections.

3. Sputtering cathode according to claim 2, characterized in that the pole faces of the pole shoes are set back with respect to the end faces of the projections, in a direction normal to the sputtering surface.

* * * * *

UNITED STATES PATENT AND TRADEMARK OFFICE
CERTIFICATE OF CORRECTION

PATENT NO. : 4,933,064

DATED : June 12, 1990

INVENTOR(S) : Geisler, et. al.

It is certified that error appears in the above-identified patent and that said Letters Patent is hereby corrected as shown below:

Column 4, lines 28 and 29, delete "hollow cylindrical space 26" and insert --trough- like space 26--.

Column 5, line 31, after "averaged" delete ";b".

Column 6, lines 14 and 15, delete "oval target 9" and insert --oval target 39--.

Signed and Sealed this

First Day of September, 1992

Attest:

DOUGLAS B. COMER

Attesting Officer

Acting Commissioner of Patents and Trademarks